United States Patent
Jagt et al.

(10) Patent No.: US 8,957,428 B2
(45) Date of Patent: Feb. 17, 2015

(54) COATED LIGHT EMITTING DEVICE AND METHOD FOR COATING THEREOF

(75) Inventors: Hendrik J. B. Jagt, Eindhoven (NL); Christian Kleynen, Deventer (NL); Aldegonda L. Weijers, Eindhoven (NL)

(73) Assignee: Koninklijke Philips N.V., Eindhoven (NL)

(*) Notice: Subject to any disclaimer, the term of this patent is extended or adjusted under 35 U.S.C. 154(b) by 0 days.

(21) Appl. No.: 13/120,299

(22) PCT Filed: Sep. 21, 2009

(86) PCT No.: PCT/IB2009/054128
§ 371 (c)(1),
(2), (4) Date: Mar. 22, 2011

(87) PCT Pub. No.: WO2010/035206
PCT Pub. Date: Apr. 1, 2010

(65) Prior Publication Data
US 2011/0175117 A1    Jul. 21, 2011

(30) Foreign Application Priority Data

Sep. 25, 2008 (EP) .................... 08165066

(51) Int. Cl.
*H01L 29/18* (2006.01)
*H01L 33/46* (2010.01)
*H01L 33/44* (2010.01)
*H01L 25/075* (2006.01)
*H01L 33/54* (2010.01)
*H01L 33/50* (2010.01)

(52) U.S. Cl.
CPC ............. *H01L 33/44* (2013.01); *H01L 25/0753* (2013.01); *H01L 33/46* (2013.01); *H01L 33/54* (2013.01); *H01L 33/505* (2013.01)

USPC .. 257/88; 257/98; 257/E33.06; 257/E33.061; 257/E27.012; 438/27

(58) Field of Classification Search
CPC ................... H01L 21/0276; H01L 27/14685; H01L 27/3239
USPC ............ 257/88, 98, E33.06, E33.061; 438/27
See application file for complete search history.

(56) References Cited

U.S. PATENT DOCUMENTS

| 4,962,985 A | 10/1990 | LeGrange |
| 6,373,188 B1 | 4/2002 | Johnson et al. |
| 7,196,354 B1 | 3/2007 | Erchak et al. |
| 7,479,662 B2 | 1/2009 | Soules et al. |

(Continued)

FOREIGN PATENT DOCUMENTS

| EP | 1780592 A1 | 5/2007 |
| JP | 2002353507 A | 12/2002 |

(Continued)

*Primary Examiner* — Elias M Ullah
(74) *Attorney, Agent, or Firm* — Meenakshy Chakravorty

(57) ABSTRACT

The present invention relates to the field of a light emitting device (1), comprising a light emitting diode (2) arranged on a submount (3), said device having a lateral circumference surface (6) and a top surface (8), and an optically active coating layer (7), said coating layer (7):
  covering along at least a part of said circumference surface (6),
  extending from the submount (3) to said top surface (8), and
  essentially not covering the top surface (8). A method for producing the device is also disclosed.

9 Claims, 4 Drawing Sheets

(56) References Cited

U.S. PATENT DOCUMENTS

| | | |
|---|---|---|
| 7,936,418 B2 | 5/2011 | Ishii et al. |
| 2003/0141563 A1 | 7/2003 | Wang |
| 2005/0062140 A1 | 3/2005 | Leung et al. |
| 2005/0264194 A1 | 12/2005 | Ng et al. |
| 2005/0269582 A1 | 12/2005 | Mueller et al. |
| 2007/0120135 A1 | 5/2007 | Soules et al. |
| 2008/0218072 A1 | 9/2008 | Haruna et al. |
| 2009/0244882 A1* | 10/2009 | Samber et al. .................. 362/84 |

FOREIGN PATENT DOCUMENTS

| | | |
|---|---|---|
| WO | 2007039849 A1 | 4/2007 |
| WO | 2007144809 A1 | 12/2007 |
| WO | 2011010234 A1 | 1/2011 |

* cited by examiner

COATED LIGHT EMITTING DEVICE AND METHOD FOR COATING THEREOF

FIELD OF THE INVENTION

The present invention relates to a light emitting device comprising a light emitting diode arranged on a submount, said device having a lateral circumference surface and a top surface, and an optically active coating layer. A method for applying such coating layer on a light emitting device is also disclosed.

BACKGROUND OF THE INVENTION

High power light emitting devices, containing light emitting diodes (LEDs), are used in an increasing number of illumination applications today. Generally, two material systems for making high-power LEDs are used.

InGaN is used to produce efficient blue LEDs

AlInGaP is used to produce efficient red and amber LEDs.

Both material systems suffer from severe losses in efficiency when their material composition is changed to shift the emission wavelength from blue towards green and from red towards green.

By application of wavelength converting materials, such as fluorescent and/or luminescent materials, in the path of light, the emitted wavelength can be adapted to many specific wavelengths. Blue and/or UV-light emitting LEDs are especially suitable as the light source in such light emitting diodes (or wavelength converted light emitting diodes) due to that the wavelength converting materials typically absorb at least part of the light emitted by the diode and emits light having a higher wavelength (a red-shift).

The InGaN systems can be combined with such a wavelength converting material, or optical component, for example a phosphor material, to convert part of the high energy, low wavelength blue light to lower energy, higher wavelengths. In such a way, by combining the blue LED with appropriate phosphor bodies on the LED, white LEDs can be produced (typically using YAG:Ce phosphors), or a blue LED can be converted to a green, yellow, amber or red LED using suitable phosphor materials. This color conversion comes with efficiency losses (mainly Stokes shift loss), but the high starting efficiency of blue LEDs makes even full-conversion to amber and red an attractive alternative to direct emitting AlInGaP systems that suffer from thermal efficiency issues.

JP 2002353507 discloses a light emitting body, wherein a fluorescent substance, which changes the light emitted to another color, is stabilized. This is achieved by filling slots inside a LED by a resin containing phosphor, as a die bonding agent to stabilize the total amount of the resin.

Conventional LED phosphor technology uses phosphor pigments or powder particles embedded in a resin on top of the LED. This leads however to backscattering losses and processing variations. A new technology makes use of a ceramic phosphor technology called "Lumiramic" technology (a Lumiramic converter is described in US2005/0269582 A1). This technology makes it possible to produce highly photo—and thermally stable ceramic phosphor platelets with well defined thickness and geometry to match the LED geometry, which is typically square, by 1×1 mm. By controlling the porosity in these ceramic phosphor bodies, or phosphors, the path length differences with angle can be sufficiently scrambled/scattered to provide a rather uniform over-angle color performance while sacrificing some light through backscattering towards the LED.

By using the Lumiramic technology, white LEDs can be made (using e.g. YAG:Ce phosphors) by partial conversion of blue light to higher wavelengths. Also, green, amber and red LEDs can be made by attempting to fully absorb the blue LED light and efficiently convert it to a color spectrum matching green, amber or red characteristics.

However, this platelet phosphor technology requires a non-negligible thickness of the phosphor body compared to the size of the LED. The phosphor body typically has a thickness in the order of 120 μm in a size of 1×1 mm for a white LED. This results in a significant contribution of the light emission from the four lateral, or side, surfaces of this squared volume.

Furthermore, the LED itself has a side surface with non-negligible light extraction. The LED chip may be of the "flip-chip" type, where both leads are positioned on the same side of the chip. This design facilitates the arrangement of the wavelength converting body on the light emitting surface of the device. In "flip-chip" LED-technology, the LED is mounted with the substrate, or the light transmissive body, thereon. When this substrate, typically sapphire, is not removed, this sapphire substrate of a thickness of typically 100 μm also gives a significant side surface contribution. To solve this issue, the substrate may be removed in a lift off process. Still, the InGaN LED stack, consisting of quantum wells and anode, cathode and reflector, may have a thickness in the order of 10 μm and consist of materials with high refractive index, resulting in considerable waveguiding and non-negligible side emission.

A bonding layer, connecting the LED and the Lumiramic phosphor, adds to the side surface thickness and typically has a thickness of 10 μm.

Examples of bonding materials include for example a silicone resin.

The disadvantages relating to the light emitted from the lateral (edge) surfaces of a light emitting device are as follows:

Non-converted light, such as blue light, leakage from the edge surfaces arising from the LED edges and the bond edges. For partial conversion Lumiramic, this may result in excess of blue light as well as significant variations of blue light flux present at large angles with respect to the normal direction and therefore reducing the over-angle color uniformity and consistency. Especially layer thickness variations, such as bond thickness, and phosphor placement inaccuracies as occur in processing yield variations of blue light leakage from the side faces. For full conversion Lumiramic, blue light leakage highly reduces the color purity of the green, amber or red LED. In addition, this light leakage reduces the efficiency as part of the blue light is not converted to the desired color.

A wavelength conversion through the lateral edges of the phosphor that is different in spectrum compared to the conversion spectrum from the top surface of the phosphor, due to path length differences between light emitted from the sides and from the top surface. This is especially unwanted for full conversion phosphors, as incomplete conversion through the phosphor sides reduces color purity of the LED.

A light flux emission from the side surfaces that is partly (roughly by half) directed downward, back to the submount that is usually located next to the LED die. Generally, such light emitted towards the wrong side, as well as light emitted to the top direction but at large angles with the normal direction is hard to capture effectively in an optical system combined with the light source, such as collimator optics, lenses etc., and therefore is likely to reduce system efficiency. Similarly, the downward light flux interacts with the submount and typically will be partly absorbed, partly reflected and usually affected in color by the interaction with the submount surface.

The light scattered or reflected from the submount also increases the LED source area and results in stray light, which is undesired for etendue critical applications, such as automotive front lighting or projection LED systems.

An increased etendue compared to the active LED surface area. This is caused by the increased surface area of the phosphor surface compared to the surface area of the LED. The phosphor sides will contribute to an increased source area even if the phosphor top surface area is similar to the LED. This is especially important in etendue critical applications, such as automotive front lighting, camera or video flash modules or projection LED systems.

In conclusion, the various embodiments of light emitting devices all suffer from disadvantages related to the side edges of the Lumiramic and/or the bonding layer and/or LED die. These disadvantage are mainly related to color variations or limited color purity due to unwanted spectral differences between the side-emission and the top-emission. Moreover, there will be a wavelength conversion light flux emission from the side surfaces partly (roughly by half) directed downward and sideward that is hard to use effectively in an application. In addition, the etendue may also be increased compared to the active LED surfaces area, which is a disadvantage in etendue critical applications, such as projection LED systems, automotive headlamps or spot lights.

A method for coating a light emitting device has been disclosed in US 2005/0062140, using a mold for applying materials with light conversion particles on an LED device. However, this method involves a specific coating apparatus, and is laborious and expensive.

Thus, there is a need for a light emitting device and methods for producing such light emitting devices that does not suffer from unwanted color variations or purity and efficiency losses due to light emission through the lateral edges of the light emitting device, or gives increased etendue compared to the active LED surface area.

SUMMARY OF THE INVENTION

It is an object of the present invention to at least partly overcome these problems, and to provide a light emitting device and a method for producing such a light emitting device that does not suffer from loss of efficiency due to scattering of light through the lateral surfaces of the light emitting device.

Hence, according to a first aspect, the present invention provides a light emitting device 1 comprising a light emitting diode 2 arranged on a submount 3. The device has a lateral circumference surface 6 and a top surface 8, and an optically active coating layer 7. The coating layer 7:

covering along at least a part of said circumference surface 6, extending from the submount 3 to said top surface 8, and essentially not covering the top surface 8.

When at least part of the lateral circumference surface of the light emitting device is covered by an optically active coating layer from the submount to the top surface, but essentially not including the top surface, the light escaping from the lateral surface may be controlled. In such a way, the light may for example be increased at the top surface.

In embodiments of the invention, the optically active coating layer is selected from the group of reflective, diffusing, spectrally filtering, luminescent, and light blocking coating layers, and combinations thereof.

When such optically active coating layer is used to coat the lateral circumference surface, the coating layer will become reflective, diffusing, spectrally filtering, luminescent, or light blocking, according to choice.

In embodiments of the invention, the device further comprises an optical component 4 arranged on the light emitting diode, selected from the group of a phosphor body, a light transmissive body and a reflecting body, and combinations thereof. In embodiments of the invention, the reflecting body is arranged so that the light will escape through at least a part of the lateral circumference surface.

In embodiments of the invention, further comprising an optical component arranged on the light emitting device.

In embodiments of the invention, the coating layer is solid. The lateral circumference surface may also be coated by more than one coating layer.

In embodiments of the invention, the light emitting devices according to the invention may be arranged in arrays.

By arranging light emitting devices according the invention having a coating layer on the lateral circumference surface in arrays, optical crosstalk may for example be avoided between the individual light emitting devices. Thus, the light emitting devices can be individually addressed.

The array of light emitting devices may also be arranged to share coating layer.

According to a second aspect, the present invention provides a method for applying a coating layer on at least a part of a lateral circumference surface 6 of a light emitting device 1 comprising a light emitting diode. The method comprises:

arranging an optically active coating layer 7 on at least a part of the circumference surface 6, the coating layer 7 extending from the submount 3 to the top surface 8, and essentially not covering the top surface 8.

The present inventors have realized that by using the method of the present invention to coat the lateral circumference surface, or lateral edge, of the light emitting device, a rapid and simple coating method can be achieved. The coating of the device may furthermore be achieved by using capillary force, to coat the lateral circumference surface. Due to this solid coating layer formed on the lateral circumference surface and the tuned optical properties of this coating, the light properties escaping the lateral edge of the light emitting device are controlled.

In embodiments of the invention, the method further comprises the steps of;

applying a first liquid coating composition on the submount 3, allowing the first coating composition to cover at least part of a first lateral circumference surface 6 of the light emitting device 1, and solidifying the first coating composition to obtain a first solid coating layer 7 on the at least part of the first lateral circumference surface 6.

In embodiments of the invention, the coating composition is by capillary force allowed to cover at least part of a first lateral circumference surface 6.

In embodiments of the invention, the coating composition is applied by a method selected from the group of by needle dispense, nozzle dispense, by printing and by spraying.

When these application methods are used, an exact amount of coating composition may be achieved. Thus, it is possible to control the amount of coating layer by controlling the amount of coating composition used.

In embodiments of the invention, the liquid coating composition upon solidification forms a solid coating layer selected from the group of reflective, diffusing, spectrally filtering, luminescent, and light blocking coating layers, and combinations thereof.

When such a solid coating layer is formed, the light leakage from the lateral circumference surface of the light emitting device may be controlled. Thus, for different purposes, the coating composition may be selected to form a reflective, diffusing, spectrally filtering, luminescent, or light blocking layer.

The coating composition may comprise a sol-gel derived material or a silicone resin.

In embodiments of the invention, the lateral circumference surface may be pre-treated to become polar, when a polar coating composition is used. Alternatively, the lateral circumference surface may be treated to become apolar, and an apolar or polar coating composition may be used.

When the submount and the lateral circumference surface are pretreated in such a way, a polar coating composition will be facilitated by capillary force to cover the submount. By only treating a part of the submount and the lateral circumference surface to become polar, it is possible to coat only some parts of the lateral circumference surface. As a consequence, it is also possible to obtain parts of the lateral circumference surface devoid from the coating layer. Similarly, an apolar coating composition may be may be used on a surface pretreated to become polar or apolar, in order to coat selected parts of the lateral circumference surface.

In embodiments of the invention, the method further comprises the steps of;

applying at least a second liquid coating composition on the submount, allowing the second coating composition to cover at least part of a second lateral circumference surface of the light emitting device, and solidifying the second coating composition to obtain a second solid coating layer on the at least part of the second lateral circumference surface.

The first coating composition may in an embodiment be different from the second coating composition.

Due to using different materials in the first and the second coating layer, it is possible to achieve different solid coating layers having reflective, diffusing, spectrally filtering, luminescent, and light blocking optical functionalities. Thus, the same lateral circumference surface may be coated by more than one coating layer having the same or different optical functionality.

The first lateral circumference surface may in another embodiment be different from the second lateral circumference surface.

When different lateral circumference surfaces are coated by different solid coating layers, parts of the lateral circumference surface receive different optical functionalities.

It is further to be noted that the present invention relates to all possible combinations of the claims.

These and other embodiments are described more in the detailed description.

BRIEF DESCRIPTION OF THE DRAWINGS

This and other aspects of the present invention will now be described in more detail, with reference to the appended drawings showing currently preferred embodiments of the invention. As an example, the drawings show reflective coating layers. However, the coating layer may be luminescent, colored, scattering and absorbing as well. The drawings are not necessarily according to scale.

DETAILED DESCRIPTION

In the following, embodiments of light emitting devices according to the present invention are described in more detail.

Figure 1:
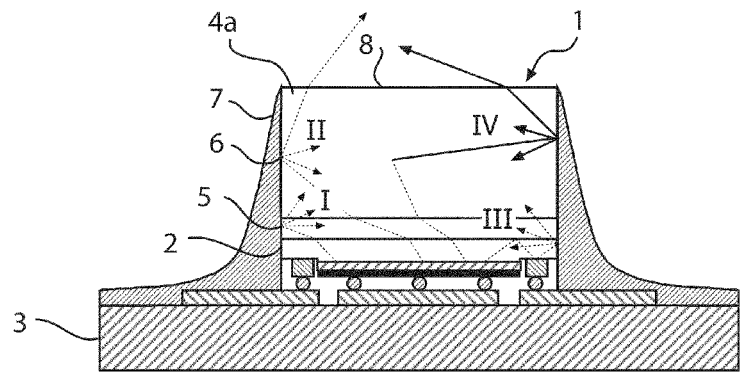
FIG. 1 illustrates schematically a cross section of one embodiment of a top emitting light emitting device of the present invention, having a Lumiramic phosphor body, wherein the lateral circumference surface is coated by a reflective coating layer.

Accordingly, an embodiment of the device of the present invention is illustrated in FIG. 1.

Thus, in this embodiment, a light emitting device 1 comprising a flip chip LED 2, is arranged on a submount 3. On the LED 2, an optical component 4, in this embodiment a phosphor body 4*a*, i.e. a Lumiramic, is arranged to receive the light emitted by the LED 2. A bonding layer 5 is used to connect the phosphor body 4*a* and the LED 2. Arranged on the lateral surface, or lateral circumference surface, 6 of the light emitting device 1, is a coating layer 7 having reflective functionality, such that the light does not substantially escape via the lateral surface 6 of the light emitting device 1. Instead, it is reflected to eventually exit via the top surface 8 of the phosphor body 4*a*.

As used herein, lateral surface, lateral edge, lateral side and lateral circumference surface all refer to the lateral surface area around the light emitting diode, but not including the top surface area.

In ray set I, the blue light generated at the p,n-junction is transmitted to the bonding layer and incident on the side coating resulting in diffuse backscattering towards the bond, the phosphor or the LED.

In ray set II, the blue light is not converted in the phosphor and reflected back to the phosphor. Part of the reflected light is extracted through the top surface.

In ray set III, the generated light is waveguided in the high index InGaN material (n=2.7) and incident at the edges where it is back reflected by the side coating. The angular redistribution in the backscatter process helps to overcome the entrapment of light by waveguiding. Part of the light is therefore extracted from the LED towards the bond and phosphor layers.

In ray set VI, blue light is absorbed in the phosphor and converted to e.g. red light. The red light travels in a direction such as to hit the side surface and is backscattered and partly extracted through the top surface. Since the ray sets are similar in embodiments which are similar to each other, not all embodiments contain specific reference to the ray sets.

Many variations of embodiment 1 may be perceived. For example, full conversion or partial conversion phosphor top emitter may be used. For full conversion, the phosphor absorbs blue light and converts it to a large extent to another color with higher wavelength. The amount to which this occurs depends on the Lumiramic thickness and the concentration and absorption coefficients of the luminescence centers in the phosphor. It is strived to achieve sufficiently large path lengths in the phosphor to convert nearly all blue light to larger wavelengths such as green, amber or red. Due to the side coating, the over-angle color performance is very good, i.e. there is no blue light leak at larger angles.

Figure 2:
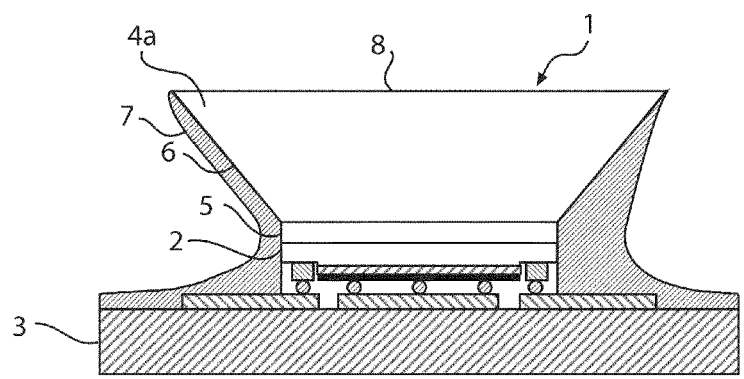
FIG. 2 illustrates schematically a cross section of another embodiment of a top emitting light emitting device of the present invention, having a Lumiramic phosphor body which is angled, wherein the lateral circumference surface is coated by a reflective coating layer.

Another embodiment of the device of the present invention is illustrated in FIG. 2.

This embodiment is similar to embodiment 1, except that the side faces of the phosphor body 4a are angled, to have an overhang compared to the LED. Reflective coating is present on the right and left side faces, but with different angles.

In that case, the phosphor size is larger than the LED size. The bond layer between the LED and the phosphor may cover either substantially the LED area or the larger phosphor area. If the bond area is smaller than the phosphor area, only the overhang area may be filled up with the coating to e.g. block the side-emission of the LED and/or the bond, not covering the lateral side of the phosphor. Alternatively, both the overhang area as well as the sides of the phosphor may be covered. Moreover, the overhang may have different shape, such as angled or square.

The phosphor may also be undersized with respect to the LED area or the placement of the phosphor might be inaccurate not to fully cover the LED area, but to show both overhang or tilt in a specific direction. The side-coating provides the means to cover and screen-off the directly emitting parts of the LED. Undersized Lumiramic can have a better bonding and placement accuracy in production.

The bond area may expand beyond the LED area and the phosphor area and part of the bond material may cover part of the lateral sides of the LED and the phosphor.

The coating may extend on only part of the lateral surface, or the entire surface, as long as it extends from the submount to the top surface, but not including the top surface. It is possible only to coat the Lumiramic, or to coat the LED. This is achieved by tuning the wetting behavior of the submount and the lateral surface of the light emitting device.

In another embodiment, it is also possible to coat under the LED where the electrical contact with the submount is made. Due to electrode patterning, some light will leak through the gaps between the electrodes or mirrors. This light can waveguide at the rear of the LED where it will likely be absorbed. If a reflective side coating is used, this light is scattered backward toward the LED to be re-used.

When a reflective coating layer is used, it may also spread on the submount surroundings such as to increase the reflectivity of the submount, and thereby reducing light loss of any light directed back to the LED.

In another embodiment, the light emitting device may be domed.

Figure 3:
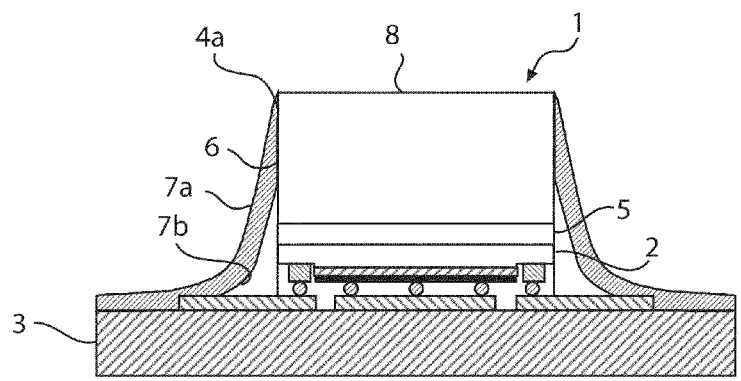
FIG. 3 illustrates schematically a cross section of another embodiment of a top emitting light emitting device of the present invention, having a Lumiramic phosphor body, wherein the lateral circumference surface is coated by two coating layers.

Yet another embodiment of the device of the present invention is illustrated in FIG. 3.

This embodiment is similar to embodiment 1, but has two coating layers 7a and 7b. The first coating layer 7b is transparent and the second coating layer 7a is reflective. Other combinations of functionalities and number of layers are feasible as well. However, a benefit with such a coating combination may be the opportunity to fill-up part of the bonding layer or underfill area that is incompletely present. For example, variations in the bonding process may result in incomplete bonding layers that do not fully cover the gap between die and LED. This can first be filled up with a transparent layer and then be covered with, for instance, a reflective layer. Otherwise the reflective layer would fill up the gaps and result in screening-off part of the light flux which would result in light losses. Other combinations of coating layers may of course be possible.

Figure 4:
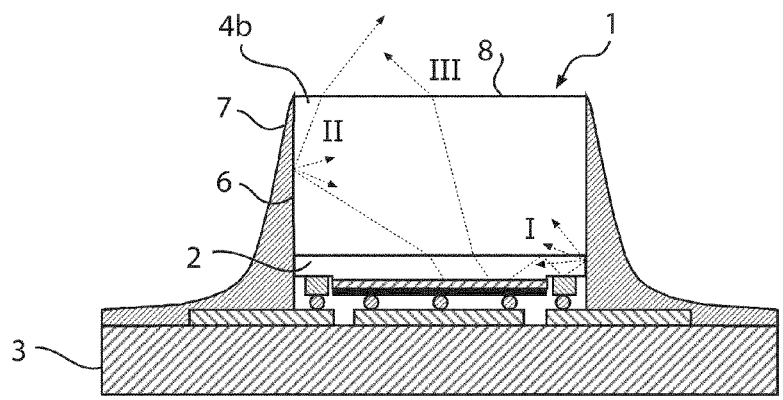
FIG. 4 illustrates schematically a cross section of another embodiment of a top emitting light emitting device of the present invention, having a substrate, wherein the lateral circumference surface is coated by a reflective coating layer.

Another embodiment of the device of the present invention is illustrated in FIG. 4.

Thus, in this embodiment, a light emitting device 1 comprising a flip chip LED 2, is arranged on a submount 3. On the LED 2, the substrate 4b is still present. Arranged on the lateral surface 6 of the light emitting device 1 is a coating layer 7 having reflective functionality, such that the light does not substantially escape via the lateral surfaces 6 of the light emitting device. Instead, it is reflected to eventually exit via the top surface 8 of the substrate 4b. In FIG. 4, three ray paths are shown. Ray path I indicates light waveguiding in the LED to the edges that is reflected back by the coating. Ray path II shows a light path through the sapphire substrate with reflection at the side. Ray path III shows a direct emissive ray path without interaction with the sides.

Accordingly, different reflective, absorbing, colored, diffusive and luminescent coating layers may be present on the lateral surface, as well as combination of coating layers. It is also possible that only part of the surface is coated. A combination of an LED with a substrate such as sapphire and a phosphor body is also possible.

In a diffusive coating layer, the incident light is mainly transmitted with slight deviations from its light path (a slight amount of the incident light may undergo multiple scattering events and still be reflected). This diffusivity helps to scramble angular dependent color effects, i.e. light of different positions and angles is mixed. Preferably, the side coating has a limited optical thickness, such as 10 to 100 μm, but this is not strictly necessary. In that case, the light source area is not significantly enlarged as a consequence of the scattering events, in which the scattering centers can be regarded as new point sources for light rays.

In another embodiment, the side coating is colored such as to absorb blue light and transmit yellow or amber or red light. Due to the side coating, blue light leakage at large angles is suppressed while the converted light is still transmitted. The blue light absorption will result in a lower efficiency compared to the reflective side coating. However, the converted light will be used more efficiently as it can easily be extracted from the pcLED, also from the sides.

In another embodiment, an absorbing side coating for the wavelengths of consideration is contemplated, which usually means that the coating is absorbing for visible light, i.e. the coating is black. This case is less preferred for obvious reasons of efficiency. However, light leakage from the sides is efficiently suppressed, but this holds for both blue light as converted light (unless the converted light is in the infra red, provided the black coating is transparent in the IR).

In another embodiment, the light emitting device has luminescent side coatings in which the blue light is (partly) absorbed and converted to higher wavelengths and re-emitted. The side coating may contain similar phosphor particles as the Lumiramic phosphor material (e.g. YAG:Ce for partial conversion white). The side coating may also contain phosphor particles that differ from the Lumiramic material, e.g. a red phosphor containing side coating in order to make the white light emission from the Lumiramic phosphor warmer in color, i.e. a warm-white configuration.

Figure 5:
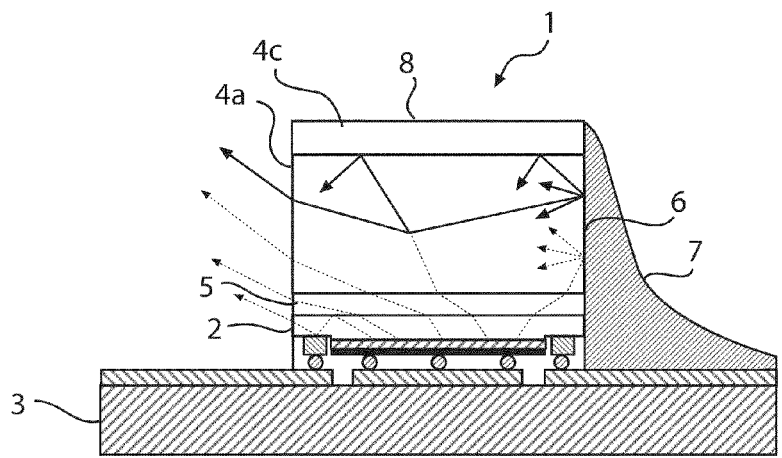
FIG. 5 illustrates schematically a cross section of one embodiment of a side emitting light emitting device of the present invention, wherein part of the lateral circumference surface is coated by a reflective coating layer.

Another embodiment of the device of the present invention is illustrated in FIG. 5.

Thus, in this embodiment, a side emitting light emitting device 1 comprising a flip chip LED 2, is arranged on a submount 3. Arranged on the LED 2 is a Lumiramic phosphor body 4a. Arranged on the phosphor body is a reflecting body 4c, reflecting the light. The coating of the lateral surface 6 prevents light transmission from one or more sides and reflects and recycles this light in order to transmit it to the uncoated side. For a squared Lumiramic, only one side surface may be coated, or two surfaces or three surfaces or parts of each of the surfaces. For instance, also a corner of the Lumiramic may be left open to emit the light from that corner area. The side reflective coating and top reflective coating may form one single layer, such as a highly scattering reflective coating layer.

In one embodiment of a 1×1 mm configuration, with a phosphor thickness of 250 μm, and a lumen efficacy of the uncoated side-emitter of 100%, the lumen efficacy was 95% of the first side surface coated LED, 78% for the second side surface coated LED and 56% for the third side surface coated LED. Part of the light is therefore lost in the LED, but the remaining flux is forced through a smaller area and to specific sides. The brightness of the side surfaces therefore increases. This is important in, for instance, backlight applications or lightguide luminaire designs in which the light should be effectively coupled into thin lightguides in order to position the lightsources at the sides of the lightguide plate.

Figure 6:
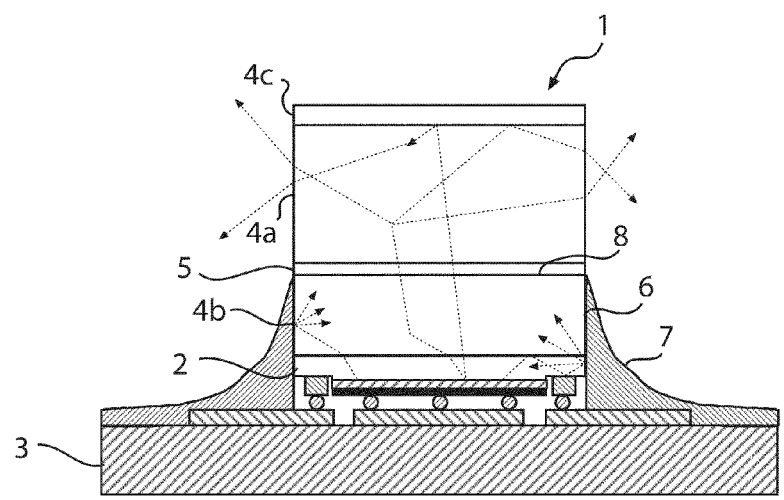
FIG. 6 illustrates schematically a cross section of one embodiment of a side emitting light emitting device of the present invention, having a substrate and a phosphor body, wherein part of the lateral circumference surface is coated by a reflective coating layer.

Yet another embodiment of the device of the present invention is illustrated in FIG. 6.

In this embodiment of a side emitting light emitting device, similar to embodiment 5, a substrate is still present on the LED underneath the phosphor body. The coating layer is only present on the LED and substrate, not on the phosphor body.

As an alternative, the reflecting body may be arranged directly on the substrate. Coating may be present on the lateral surface of the substrate, without significant blue light leakage from the LED substrate side by using a reflective side coating. The phosphor may also extend beyond the LED substrate area (be oversized).

However, side emitting light emitting devices may also have other types of coating layers, such as diffusive or luminescent coating layers. By using a diffusive side-coating the angular and spectral distribution of the side-emission may be influenced, e.g. to make it more uniform.

By using a side coating that absorbs blue light and transmits converted light (e.g. amber light), a full conversion side emitter can be made with high color purity.

By dispensing at two sides, different optical functionalities can be realized at different side surfaces, e.g. a reflective coating can be added on the first, second or third side surfaces and a blue absorbing, and a converted light emitting colored coating on the other sides.

Thus, in another embodiment, on at least one side of the LED, a reflective side coating is deposited, on the other sides a colored side coating. This can be used to produce a high color purity side-emitting full conversion LED with one, two or three emitting side surfaces.

Phosphor coated LEDs, pcLEDs, are for example particularly useful in high brightness or etendue limited applications, such as spot lamps, flash LED modules, projection displays and automotive headlights.

For some of these applications (e.g. in tunable spots or in car headlights that shine into a turn), the LEDs need to be individually addressable so each separate LED can be turned on/off or dimmed as requested by the user/situation.

One of the problems with LED arrays in individually addressable arrays is that pump light of one LED can easily reach the phosphor of a neighboring LED in the array. This can e.g. cause a lamp to give the wrong output spectrum or an LED turned on in a headlight whereas it should be in the off-state.

Figure 7:
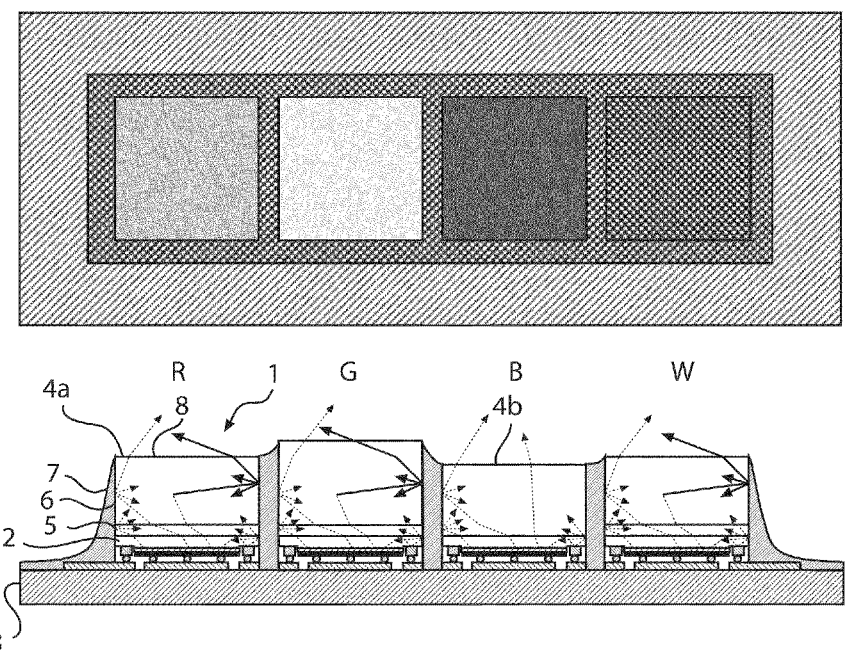
FIG. 7 illustrates schematically a cross section of one embodiment of an array of light emitting devices of the present invention, wherein part of the lateral circumference surface is coated by a reflective coating layer.

Yet another embodiment of the device of the present invention is illustrated in FIG. 7.

In this embodiment, an array of light emitting devices having varying colors are coated Lumiramic phosphors are used to get R=red, G=green and W=white light, whereas a sapphire substrate B is used to get blue light from the light emitting device. The reflective coating is arranged on the lateral surfaces around and between the light emitting devices, so that the light emitting devices even share coating layer.

The arrays may be 1-dimensional or 2-dimensional. The gap between the LEDs may be filled with a reflective coating by capillary force or by plotting. The gap between the LEDs may also be partly filled or filled with a layer with different functionality, such as transparent, luminescent, diffuse, colored or luminescent layer. The LEDs may be driven simultaneously, such as when placed in series, or the LEDs may be driven independently. The arrays may also have the same color, and the coating may only be arranged on the lateral surfaces of the devices, so that the coating is not shared between the devices. The arrays may also consist of LEDs each having their individual side-coating, in that case not sharing their coatings layers.

In particular, an LED array with red full conversion Lumiramic, green full conversion Lumiramic, a blue LED with substrate and, optionally, a partial conversion white Lumiramic is contemplated. Generally, the thickness of the various phosphors and/or substrates may vary. The side coatings can accommodate such height differences. The reflective coating will suppress optical crosstalk between the LEDs, such as to produce an LED array with a wide range of high purity colors when the LEDs can be individually addressed. This produces a light source with an extremely large window of color mixing, i.e. from very pure colors to any mix of these colors within the spanned color range in the color diagram. This is important for color-controllable LED light sources for instance for spot-lights or general illumination light sources.

When optical mixing is required on a small distance, the side coatings between the LEDs can be made transparent or diffuse, however in that case, optical cross talk between the LEDs will influence the performance. For instance, when only the red LED is on, the blue light generated from this LED will also be able to excite the neighboring green phosphor to produce some green as well.

To prevent this crosstalk while still maximizing the mixing capability, a colored or luminescent pigmented coating may be applied between the LEDs which absorbs blue light traveling from one LED to the next. In case of a luminescent coating, this blue light will be converted again to another color.

In another embodiment, squared arrays may be used, such as 2×2 arrays. Alternatively, instead of a 1×4 array, also larger arrays may be made analogously, such as a 4×4 array with alternating RGBW, GBWR, BWRG, WRGB (R=red, G=green, B=blue and W=white) colors.

In yet another embodiment, by applying a phosphor array on a single LED and using side coatings, the LED can be subdivided in high color purity areas with x,y color coordinated corresponding to red, green and blue position in the color diagram. The light emission from these colored areas will mix depending on the distance to the LED. The advantage is that the colors can be made from pure RGB colors in order to obtain a white LED that has can be combined and matches to RGB color filters arrays in applications such as LCD backlighting or projection displays. (A YAG:Ce partial conversion Lumiramic is a white LED not built up from mixed pure colors and is therefore less suited in combination with color filters). The area between the phosphors may be made transparent or diffuse in order to promote light mixing. The outer side coating preferably is reflective in order to minimize color shadows at the sides of the LED.

In another embodiment, arrays of side emitting Lumiramic LEDs are coated. Instead of placing individual full conversion side-emitters with side coatings next to each other, the neighboring LEDs can be placed such as to share side-coatings. In that case, the side-coating can be regarded as an interface coating between the neighboring LEDs and the LEDs can be placed closer together. By using reflective side coatings, the crosstalk between the LEDs is suppressed, such as to achieve an LED array with emission that can range from high purity individual colors to any mix of these colors.

In case individual colors are not required and an optimal color mixing is required, the coatings between the LEDs can be made transparent, diffusing, colored or luminescent. In the first two options, both blue and converted light can waveguide to the neighboring LEDs. In the latter two options, blue light will be (at least partly) absorbed and the converted light will be able to waveguide to and mix with neighboring pixels.

In another embodiment, reflective side coatings are placed on Lumiramic phosphors with a wire-grid polarizing structure on the phosphor surface. In that case the sides of the phosphor without polarizing structure are blocked from leaking unpolarized light.

In conclusion, the invention can be applied in LED configurations typically using phosphor conversion. However, the side coating technology can also be applied for normal colored (non-phosphor conversion) LEDs. The LEDs find applications in flash lights, automotive front or rear lights, backlights or general illumination such as spot lights.

The inventions can also be applied in arrays of such LEDs, for instance, for use in LED arrays for automotive front lighting or in RGB LED arrays for projection illumination purposes or in general illumination color tunable (spot)lamps.

As used in this application, the term "light emitting diode" herein abbreviated "LED" refers to any type of light emitting diode or laser emitting diode known to those skilled in the art, including, but not limited to, inorganic based LEDs, small organic molecule based LEDs (smOLEDs) and polymeric based LEDs (polyLEDs).

The LEDs for use in the present invention may emit light of any color, from the UV range, over the visible range, to the IR range. However, since wavelength converting materials conventionally convert light by a red shift, it is often desired to use an LED emitting light in the UV/blue range, since such light can be converted into essentially any other color.

The LED chip is preferably of the "flip-chip" type where both leads are positioned on the same side of the chip. This design facilitates the arrangement of the wavelength converting body on the light emitting surface of the device. However, also other types of LED chips are contemplated for use in the present invention.

The wavelength converting material for use in the present invention is preferably a fluorescent and/or phosphorescent material, which becomes excited by unconverted light and emits light upon relaxation. The optical component is typically a phosphor material, for example a ceramic phosphor such as Lumiramic phosphors.

A full conversion LED is an LED where all the electrically generated light is converted to the desired color, whereas a partial conversion LED refers to an LED where only part of the electrically generated light is converted to another color.

Another aspect of the invention relates to a method for producing a light emitting device according to the present invention.

In the following, the method for applying a coating on a lateral surface of a light emitting device will be described in more detail.

The light emitting device 1 comprises a light emitting diode (LED) 2, which is arranged on a submount 3. On this submount 3, a liquid coating composition is added. The coating composition may be applied in an predetermined amount, so that a capillary force can transport said liquid coating composition to cover the lateral surface of the light emitting device. This amount is usually a droplet or a variety of droplets. However, depending on the thickness of the coating desired, this amount may also be larger. This liquid volume per LED device of 1×1 mm area may be between 0.01 and 100 micro liters, preferably between 0.1 and 10 micro liter and more preferably between 0.5 and 5 micro liter. The solid volume is usually smaller due to shrinkage during curing of the coatings and/or removal of solvents.

Figure 8A:
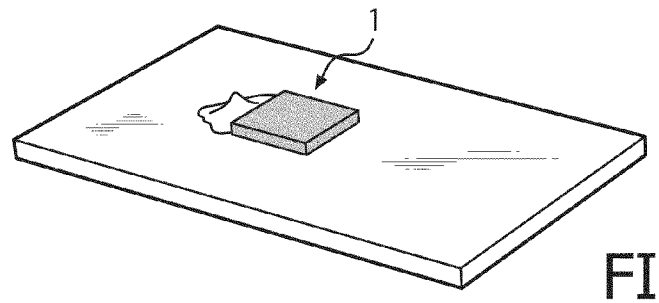
FIG. 8 *a-c* illustrates schematically a perspective view of a method for coating the lateral circumference surface of a light emitting device.
Figure 8B:
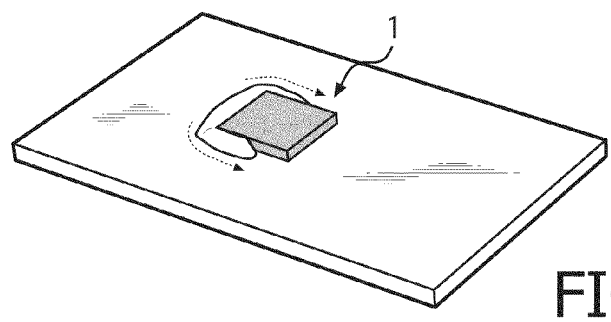
Figure 8C:
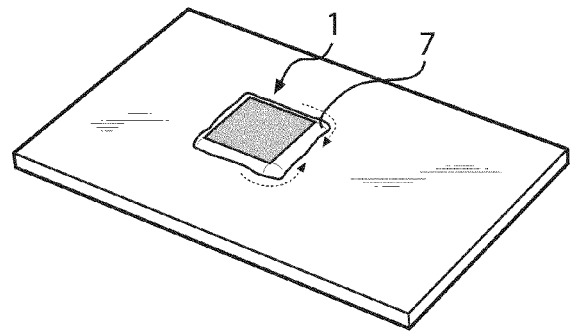

In FIG. 8 a-c, a schematic drawing is shown of the coating of the lateral surface of a light emitting device. Thus, FIG. 8a illustrates a drop of liquid placed next to the LED chip. In FIG. 8b, by capillary force, the drop starts to coat the lateral surface of the device. FIG. 8c illustrates that coating of the entire lateral surface has been achieved.

The coating composition is placed at a location on the submount, next to, or in contact with the lateral surface of the light emitting device, so that the coating composition by capillary force will cover the lateral surface. The coating composition may for example be placed 0-2 mm from the lateral surface of the light emitting device, or 0.5-1 mm from said surface.

When a coating composition is applied in such a manner, the capillary forces will more rapidly facilitate coating of the lateral edge of the light emitting device.

In order to add the specified amount of coating composition needed to the specified location, a dispenser may be used. This dispenser may be a syringe or a needle or a nozzle system. The simplest method of deposition of the coating is by applying a drop of the coating composition using a syringe, needle or nozzle with a controller to dispense a desired droplet volume, usually by regulating dispense time and pressure.

However, the addition may also be achieved by printing or spraying the coating composition, such as by using screen-printing or an inkjet nozzle or a spray nozzle.

The coating may be facilitated by using capillary forces to coat the lateral surface. The coating typically occurs by self-wetting in about 1 or 2 seconds.

The coating may also be achieved by plotting a liquid coating composition on the submount around the light emitting device, forcing the fluid to contact the plotted areas. In this case the nozzle or needle translates in a controlled and programmable way while controlling the dispense during this movement. This is an advantage if the coating fluid has a poor wetting on the device materials to be coated and it provides a way to coat only specific sides. The poor wetting prevents self-wetting, but the dispense plotting forces the fluid to spread. The disadvantages is the more critical placement accuracy that is needed and additional process times.

Also a combination of plotting and self-wetting may be realized, for instance by moving the nozzle in a straight line next to multiple LED devices separated by a short distance and placed in a straight line and dispensing while moving the nozzle in a straight line. The dispensed fluid interact with the edge of the LED device and self-wets at its circumference.

The coating composition is a liquid composition which may contain a sol-gel monomer, like an alkylalkoxysilane, such as methyltrimethoxysilane, or a silicone resin. The sol-gel monomers may be (partially) hydrolyzed and polymerized in the liquid, that may contain water and/or alcohols. This type of fluid is hence typically hydrophilic (polar). It may contain various amount of solvent or solvents to tune the viscosity of the fluid. A silicone resin typically is a fluid in uncured form and may be used as such, or optionally a solvent is added to tune the viscosity of the fluid. Silicone resins exist in many chemical compositions and material properties from various suppliers. Viscosities may vary as well as material properties after curing, ranging from elastic gels to hard silicone coatings. Depending on the type of silicone resin an example of such a solvent may be xylene. Such silicone fluids are typically, but not necessarily, apolar.

The extent to which the fluid is polar or apolar may be influence with the exact fluid compositions, such as the type and amount of solvents used.

The coating composition for use in the present invention is a coating composition that upon solidification forms a scattering, absorbing, luminescent, diffusive or reflective coating layer, i.e. an optically active coating layer. There are many examples of compositions that can be used for this purpose.

By "solid" in the present invention it also appreciated that the coating layer may be amorphous.

Typically, scattering, absorbing, luminescent, diffusive or reflecting particles are dispersed in a composition, preferably having low viscosity.

For example, scattering particles, such as of metal oxides, reflective, diffusive or luminescent metal flakes and/or absorbing dyes or pigments may be dispersed in the coating composition.

For example, $TiO_2$ particles, such as having sub-micrometer diameters, may be used as inorganic scattering particles. By using an appropriate loading, such as 5-60v % of particles, a low-loss scattering reflective coating can be realized at thicknesses exceeding e.g. 5 micron.

The coating composition is solidified to obtain a solid coating layer on the lateral surface. Solidification may occur by any solidifying action, for example by air drying the coating to remove solvents, and/or curing the coating, typically at elevated temperature. As an example, for solidification of a sol-gel monomer, the coating may be dried for about 10 minutes to evaporate most solvents from the coating (such as water and methanol). Then the coating is further dried at 90° C. for 20 min and afterwards the sol gel is cured to form a brittle methyl silicate network by curing at 200° C. for 1 hr.

A typical thickness of the coating layer is 10-500 µm.

Thus, the coating composition is selected so that upon solidification obtained solid composition has the following optical functionalities or combinations of such functionalities:

Reflective functionality, usually by using scattering pigments, such as metal oxide particles like $TiO_2$, $ZrO_2$ and $Al_2O_3$. One less preferred alternative is by using metal flakes or particles or pores. By coating the lateral edges with a coating composition having such functionality, the light transmission will be small through the side coating, and most of the light will be reflected (e.g. 95%).

This choice of functionality solves problems 1 to 4 described in the background section. A drawback is that a small amount of the reflected side light might be re-absorbed by the LED and be lost. Still, the brightness of the top surface is increased, for instance, a typical brightness gain at the normal direction with 10-15% was realized on a side-coated 1×1 mm LED die with 120 micron thick phosphor.

Diffusive functionality by using scattering pigments, such as metal oxide particles like $TiO_2$, $ZrO_2$, $Al_2O_3$ and $SiO_2$. This allows (partial) light transmission through the side coatings, in which the amount of forward scattering and backscattering can be controlled by the volume concentration and particle size of the pigments and the coating thickness.

This functionality solves problems 1 and 2 described above partially, but not problems 3 and 4. The benefit is that less light is directed back towards the, generally, lossy LED compared to the reflective functionality.

Colored or spectral filtering functionality using colored pigments. Typically the colored layer will absorb the blue LED light and transmit the converted light from the phosphor. This solves problem 1, especially for full conversion Lumiramic, but not problems 2, 3 and 4.

For partial conversion, the blue light absorption risks of a color shift over angle by absorbing too much blue light. Fine tuning of the absorptions characteristics, such as to partially absorb the blue light leakage, is needed to overcome this issue.

The benefit is the increased total light flux compared to the reflective functionality.

Absorbing functionality by using pigments absorbing the incident light flux spectrum. This solves most issues but will lead to severe light flux loss and will not increase the brightness of the top surface, and is hence less preferred. The absorbance may be complete or only partial depending on absorbing pigment or dye properties, concentration and layer thickness.

Luminescent functionality by using luminescent pigments/particles either giving the same or a different luminescent spectrum as the phosphor. Blue light leakage through the sides will be absorbed and converted to higher wavelengths. This will solve issue 1 especially for full conversion phosphors, but not issue 2, 3 and 4. It also increases the light source area slightly. The benefit is the anticipated increased total light flux compared to the reflective functionality.

Thus, for embodiments of the present invention, a combination of different coating layers having different functionalities may be considered, depending on the functionality desired or different functionalities may be combined in the same coating, such as combining a diffusive functionality with a luminescent functionality.

Figure 9:
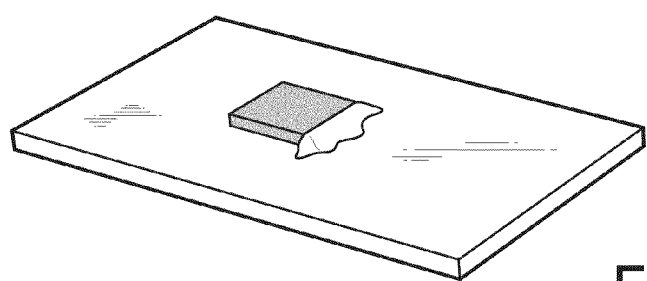
FIG. 9 illustrates a perspective view of an embodiment of a light emitting device of the present invention, wherein part of the lateral circumference surface is coated by a reflective coating layer.

The submount and the lateral surface may be pretreated in such a way as to become polar (or hydrophilic), and the coating composition may be polar (or hydrophilic). The hydrophilic (polar) coating composition will then be facilitated by capillary force to cover the treated submount and lateral surfaces. By only treating a part of the submount and the lateral surface to become hydrophilic, it is possible to coat only some parts of the lateral surface, as shown in FIG. 9. Similarly, by using an apolar (or hydrophobic) coating composition, such as most silicones, on a polar (or hydrophilic) surface, limited fluid spreading can be achieved, or good spreading on a apolar (or hydrophobic) surface can be achieved. As a consequence, it is also possible to treat part of the submount and the lateral surface to become apolar (or hydrophobic), and thus, by using a polar (or hydrophilic) coating composition, part of the lateral surface will be devoid of coating layer. Evidently, the surface wetting conditions of the submount and lateral side surfaces of the device may not be identical and a preferred spreading on either the submount or the lateral sides may be realized. Also, the lateral side surfaces usually consist of multiple components such as the LED material, bond materials, LED substrates or phosphor. Preferential wetting of these various materials may occur. For instance, if the phosphor has poor wetting conditions for the coating fluid, no or only limited side-coverage of the phosphor can be realized whereas e.g. the bond and LED die can be covered.

Another way to only coat part of the lateral surface is achieved by tuning the wetting conditions on the LED surface (e.g. by tuning an oxygen plasma or UV-ozone treatment of the LED device), the amount deposited and/or by increasing or tuning the viscosity of the coating composition, or by adding a solvent that has faster evaporation.

In principle, the coating composition might be deposited using techniques that will also cover the top of the Lumiramic, such as blade coating, spin coating, spray coating, dip coating or curtain coating. Especially in case a reflector coating is applied, a dewetting layer should be arranged at the top of the Lumiramic surface. If sufficient dewetting is present, the coating will tend to flow to the sides as it is energetically unfavorable to cover the dewetting top surface in the case of a hydrophobic coating composition, leaving no or only a thin layer on the top. A sufficiently thin layer of the reflector coating on top will still be partially transmissive and may be allowed. The dewetting layer may consist of a hydrophobic coating layer, for example a hydrophobic silane monolayer of a fluor silane top surface treatment of the phosphor. For diffusive, luminescent, colored coating compositions top surface coverage may be allowed. A diffusive topcoating may help to redistribute the light distribution to achieve more uniform color-over-angle. A luminescent or colored top coating may help to reduced blue light leakage from the top surface for full-conversion phosphor applications.

This is particularly important if the coating composition is added in large amounts. The dewetting layer may be a solid, a liquid or a gel. It may be a volume layer, but also a monolayer deposited on the Lumiramic top surface (for instance a hydrocarbonsilane or fluorosilane that has reacted with the phosphor surface from gas phase).

However, the method in which top surface spill is avoided is preferred, especially for reflective coating formulations.

The viscosity of the composition may be selected such that the composition is sufficiently low to easily spread around the light emitting device by capillary force. Thus, the viscosity may be between 1 and 100 mPas.

Also, the viscosity of the fluid may be lowered by heating the fluid and/or the device.

By controlling the viscosity, it is also possible to control the area coated by the coating composition. For example, if a lower viscosity is used, the coating composition will more easily spread and the coating will occur faster. On the other hand, if a higher viscosity is used, the coating composition will tend to spread less easily, and it will become possible to coat only a part of the lateral surface.

When good wetting is achieved on the side surfaces, the contact angle of the solid coating layer may be between 0-45 degrees. When a low contact angle is achieved by the present coating method, only little material is needed to coat the lateral surface, which may be preferable.

In addition, this has the benefit that the light source will not be significantly enlarged, that the side coating thickness (and hence the optical properties) can still be reasonably controlled and that less stress will be exerted to the side coating and LED device due to shrinkage stresses that generally occur in the curing of the side coating. The sharp profile that can be reached has little risk of waveguiding the light entering the side coating.

Accordingly, a less preferred embodiment of a side coating using a coating composition that shows poor wetting on the side surfaces or specific side surfaces is contemplated. As a result, the contact angle at the side surface will be large (e.g. between 45 and 90 degrees, or even exceeding 90 degrees). The surface coverage of the side surface may not be complete depending on the dispensed amount. By tuning the amount deposited, the area or layer that is coated can be controlled. For instance, only the LED and bonding layer can be covered, whereas a substantial part of the Lumiramic phosphor is uncovered. As such light leakage paths 1 and 2 can be suppressed, whereas path 3 still leaks through. The advantage is that more light can be extracted from the LED and the variations in side-light leakage due to bond thickness variations is suppressed. The over-angle color performance might still be sufficient for practical use. For full coverage, a large amount of material is required. Also, for colored, slightly diffuse or luminescent layers, a high risk of waveguiding in this side coating occurs which will spread out the light without substantial light extraction, which is highly unwanted.

In another embodiment of the invention, a second liquid coating composition is applied on the submount, such that it will cover at least part of a second lateral surface of the light emitting device. The second coating composition is solidified to obtain a second solid coating layer on at least a part of the second lateral surface. Similarly, multiple coating layers can be deposited on top of each other.

When the light emitted device is coated by different coating compositions in the first and the second coating layer, it is possible to achieve different solid coating layers having reflective, diffusing, spectrally filtering, luminescent, and light blocking optical functionalities. Thus, the same lateral surface may be coated by more than one coating layer having the same or different optical functionality.

Consequently, different parts of the lateral surface may have different optical functionalities.

The coating arranged on the lateral surfaces of the devices are in close proximity to the lateral sides, generally in contact. However, due to shrinkage stresses, insufficient adhesion, thermal stresses, the physical contact of the side-coating with (parts of) the lateral sides may be broken as well as with (parts of) the submount. As a result a usually small gap may exist where the contact is broken. This does not necessarily hamper the functionality of the side-coating.

Even though the invention has been described with reference to specific exemplifying embodiments thereof, many different alterations, modifications and the like will become apparent for those skilled in the art. The described embodiments are therefore not intended to limit the scope of the invention, as defined by the appended claims.

The invention claimed is:

1. A light emitting device comprising a light emitting diode arranged on and above a submount, a substrate above said light emitting diode, a wavelength converting body arranged above said substrate, and an optically active coating layer, said optically active coating layer:
   coating along a side surface of the device from the submount to a top surface of the substrate, and
   essentially not covering the top surface and not covering said wavelength converting body.

2. A light emitting device according to claim 1, wherein said optically active coating layer is selected from the group consisting of: reflective, diffusing, spectrally filtering, luminescent, and light blocking coating layers, and combinations thereof.

3. A light emitting device according to claim 1, further comprising an optical component arranged on said light emitting diode, selected from the group consisting of: a phosphor body, a light transmissive body and a reflecting body, and combinations thereof.

4. A light emitting device according to claim 3, wherein said reflecting body is arranged so that the light will escape through at least a part of the side surface.

5. A light emitting device according to claim 1, further comprising an optical component arranged on said light emitting device.

6. A light emitting device according to claim 1, wherein said coating layer is solid.

7. A light emitting device according to claim 1, wherein at least part of said side surface includes at least one other coating layer.

8. An array of light emitting devices according to claim 1.

9. An array of light emitting devices according to claim 8, wherein said light emitting devices are arranged to share said coating layer.

* * * * *